United States Patent
Gyl et al.

(10) Patent No.: US 7,562,180 B2
(45) Date of Patent: Jul. 14, 2009

(54) METHOD AND DEVICE FOR REDUCED READ LATENCY OF NON-VOLATILE MEMORY

(75) Inventors: Yevgen Gyl, Tampere (FI); Jussi Hakkinen, Tampere (FI); Kimmo Mylly, Ylöjärvi (FI)

(73) Assignee: Nokia Corporation, Espoo (FI)

( * ) Notice: Subject to any disclaimer, the term of this patent is extended or adjusted under 35 U.S.C. 154(b) by 199 days.

(21) Appl. No.: 11/390,969

(22) Filed: Mar. 28, 2006

(65) Prior Publication Data

US 2007/0239926 A1    Oct. 11, 2007

(51) Int. Cl.
G06F 12/00        (2006.01)

(52) U.S. Cl. .................................. 711/103; 365/185.01

(58) Field of Classification Search .................. 711/103; 365/185.33, 185.01
See application file for complete search history.

(56) References Cited

U.S. PATENT DOCUMENTS

| | | | |
|---|---|---|---|
| 5,509,134 A | | 4/1996 | Fandrich et al. |
| 5,822,244 A | | 10/1998 | Hansen et al. |
| 6,131,139 A | * | 10/2000 | Kikuchi et al. .............. 711/103 |
| 6,189,321 B1 | * | 2/2001 | Banhardt et al. .............. 60/739 |
| 6,260,103 B1 | * | 7/2001 | Alexis et al. ................ 711/103 |
| 6,556,480 B2 | | 4/2003 | Ravazzini |
| 6,725,321 B1 | * | 4/2004 | Sinclair et al. .............. 711/103 |
| 7,149,844 B2 | * | 12/2006 | Bernardi et al. ............. 711/103 |
| 7,155,562 B2 | * | 12/2006 | Li et al. ...................... 711/107 |
| 7,308,567 B2 | * | 12/2007 | Yamamoto et al. ............. 713/1 |
| 2003/0206456 A1 | | 11/2003 | Hsu et al. |
| 2003/0210585 A1 | | 11/2003 | Bernardi et al. |
| 2004/0049628 A1 | * | 3/2004 | Lin et al. ..................... 711/103 |
| 2004/0078509 A1 | * | 4/2004 | Malueg et al. .............. 711/100 |
| 2007/0180186 A1 | * | 8/2007 | Cornwell et al. ............. 711/103 |

FOREIGN PATENT DOCUMENTS

WO    WO 99/35650    7/1999
WO    WO 02/03388 A2    1/2002

OTHER PUBLICATIONS

SD Association, "SD Specifications Part E1, SDIO Specification", Version 1.10, Aug. 18, 2004, pp. 1-2, and 50-53.
ST Microelectronics, "How to Use the Chip Enable Don't Care Option in Single Level Cell NAND flash Memories", Mar. 2005, pp. 1-11.

* cited by examiner

Primary Examiner—Kevin L Ellis
Assistant Examiner—Hashem Farrokh
(74) Attorney, Agent, or Firm—Hollingsworth & Funk, LLC

(57) ABSTRACT

Systems, apparatuses and methods for controlling access operations in a memory device that may include a memory controller(s) and memory. Commands, registers and/or other mechanisms may be defined to be supported by the memory device, where such commands, registers, and/or other mechanisms facilitate the control of read and write/erase operations to allow these operations to be performed simultaneously. Thus, a write and/or erase operation may be initiated on a first memory, a read operation initiated by a set of commands on a second memory, wherein the read and write/erase operations are performed substantially at the same time.

18 Claims, 4 Drawing Sheets

METHOD AND DEVICE FOR REDUCED READ LATENCY OF NON-VOLATILE MEMORY

FIELD OF THE INVENTION

This invention relates to non-volatile memory devices, particularly flash memory devices with NAND architecture and more particularly to a method for reducing latencies of NAND flash memory access operations by an additional set of commands and/or registers.

BACKGROUND OF THE INVENTION

A flash memory device, such as those used in mobile terminals, usually has multiple partitions. These partitions may be binary partitions (read only) and read-write partitions. During write operations, data cannot be read from the memory until the write operation is completed. This causes read latency which might not be desirable or acceptable for real time applications. In any application, overall system performance will be faster if data can be read from read-only partitions while write operations are in process;

One example of an application where read latency is critical is the paging-on-demand-technique, where pages of data are not copied from a data storage to RAM until they are needed. Memory is organized in so-called blocks and pages, with one page typically consisting of 512 bytes. A block combines several pages and usually has a size of 16 kB. To reduce the required memory size, only pages which are currently needed for an application are loaded. Therefore, demand paging requires continuous read and write processes. In NAND flash memory systems, paging-on-demand is commonly applied, but a major drawback of systems for this technique is that read and write operations cannot be performed simultaneously. Each page retrieval operation will block the whole system until the page is fully loaded, which slows application execution down considerably.

While NOR flash does support read-while-write techniques, NOR type memory is in general not used in memory cards for several reasons. Due to the parallel architecture of NOR memory, it shows lower write and erase performance compared to NAND and is therefore mainly used as read-only memory for e.g. program code. Additionally, NOR devices take up more space on a die per stored amount of data than NAND devices, so that NAND flash is preferred for storing large amounts of data within restricted space, such as in mobile devices.

Any of the described features and problems are present in both memory cards and embedded mass storage devices based on flash memory. Therefore, a need exists to provide a method of controlling read processes on NAND flash memory cards and embedded mass storage devices in order to decrease read latency times. This may be achieved by an additional set of commands and/or registers to handle read and write operations. The new set of commands and/or registers may be regarded as a second "virtual" port of the memory controller of a flash device that allows fast read access to the memory device even if another write operation is in process.

SUMMARY OF THE INVENTION

To allow for lower read latency when accessing NAND flash memories, an additional set of commands and/or registers may be defined to be supported by the flash memory device. By means of this command and/or register set, a "virtual" port is created in addition to the existing data ports of the memory controller. This is accomplished by controlling any read/write commands in a memory device such that a read request can be handled while a write/erase operation is in process. The control may be applied with two or more NAND chips, wherein the memory controller handles the read-while write in a way that it is capable of reading from one chip while writing/erasing on another chip; or, alternatively, with NAND chips having additional functionality, such as real read-while-write access or suspend capabilities, where only one such NAND chip is needed and the memory controller may read and write on separate blocks of that one chip or suspend a write operation before performing a read operation.

BRIEF DESCRIPTION OF THE DRAWINGS

In the following, the invention is described by means of exemplary embodiments and figures for illustration, wherein FIG. 1 schematically shows a flash memory system according to an exemplary embodiment of the invention.

DETAILED DESCRIPTION OF EXEMPLARY EMBODIMENTS OF THE INVENTION

Figure 1:
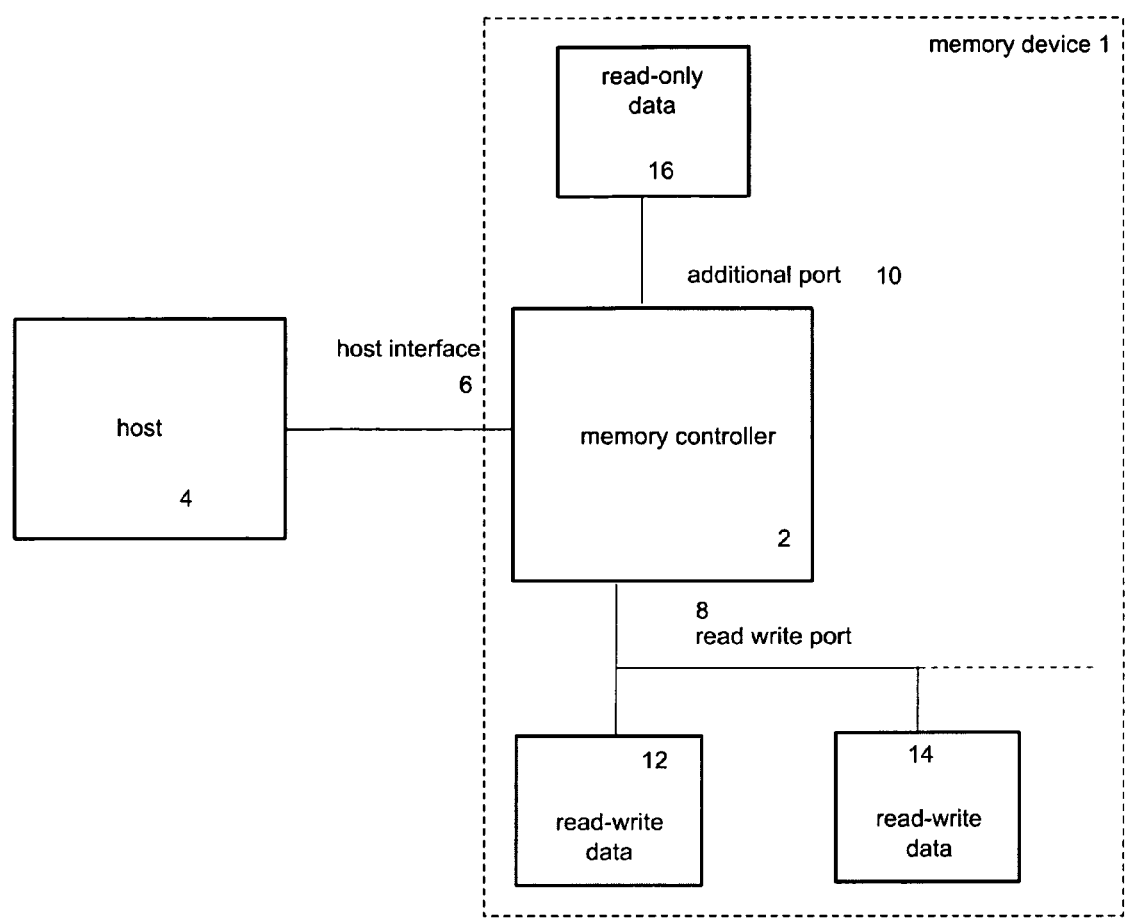

In FIG. 1, the arrangement according to the invention is shown schematically. The non-volatile memory device 1 comprises at least one NAND type flash memory chip 12, 14, 16 and a memory controller 2 which has a interface to an external host 4. The external host device 4 may be represented by a terminal comprising a processor for executing program code stored in a storage medium. The host may need information stored on the memory device 1 to execute program code or to display the information on the host, such as an internal flash memory or a flash memory card in a mobile communication terminal. The host may be capable of controlling this memory access and to communicate data with the memory device. For this purpose, the host is connected to the memory controller or, alternatively, directly to the memory device if the host is responsible for all access controls and if the structure of the memory device does not require a separate controller. The host may for example be a desktop computer, a handheld computer, a mobile telephone, a digital camera or any other kind of computer/microcontroller based terminal which can use non-volatile memory as a storage medium. The non-volatile memory device may be provided e.g. as a removable memory element (memory card) or as embedded mass storage arranged within the device.

A read/write port 8 of the memory controller 2 is used for accessing the NAND memory chips to perform read and/or write operations on the memory chip 1 according to pre-defined specifications. The memory chips include read-write data (i.e. for data storage) as well as read-only data (e.g. program code) on several partitions. The read-write data may be located in several chips or in several blocks of at least one memory chip.

By providing a set of commands (single state machine) and/or registers (multiple state machines), the memory controller is able to allow read access to one first memory unit of the memory device while writing/erasing a second memory unit of the device. The memory units may correspond e.g. to separate NAND chips or to separate blocks of at least one memory chip. In case of NAND chips which are not capable of internal read-while-write operations or suspend operations, at least two NAND chips should be provided to apply the method of the invention.

As shown in FIG. 1, the memory controller has a read-write port 8 for read and write/erase access to NAND memory chips or to at least a first memory unit 12, 14 of a NAND memory chip. Additionally, a second read-write port 10 is implemented as a "virtual" port by means of the above mentioned command set and/or registers. This port is assigned for fast read access operations to read-only data on a second memory unit 16 in the example of FIG. 1. The host may communicate with the memory controller 2 via a host interface 6, such that control of the read and write operations may optionally be performed by the host 4. Data to be written onto the memory or to be read from the memory is also transferred via the host interface.

Another exemplary embodiment employs NAND type flash memory chips with additional functionality, which are expected to be developed within near future. The additional capabilities may include actual read-while-write access on NAND chips or suspend capabilities as known from other types of flash memory. Those added features provide that only one NAND chip is necessary to implement the idea of the invention, although multiple chips may be used just as in the case of a NAND architecture as described above.

When simultaneous read/write operations are supported by a NAND chip, the memory card controller may issue commands to different memory blocks of the same NAND chip. In this way, a write/erase operation may be performed on a first memory block of a chip, while at the same time one or more read operations are performed on further memory blocks. Those may be located on the same NAND chip as the first memory block or on a different NAND chip. The memory card controller prevents overlapping of memory access (i.e. prevents more than one request being directed to a single memory bank).

To prevent such overlapping, the controller should be aware of ongoing operations anywhere on the memory device. This may for example be ensured by a busy signal or by some kind of flag that indicates that access to the memory device is requested or in process. When an ongoing operation is detected or several requests are received by the controller, it will issue the commands in such a way that it is ensured that only one command at a time is directed to one memory unit, as described above.

In a further exemplary embodiment of the invention, NAND chips with suspend capability are used to decrease read latencies. There, a write/erase operation is suspended to be able to execute a read operation with higher priority. The read process should be completed before resuming the interrupted write or erase operation. NAND memory devices with suspend times of 500 □s are available and may be sufficient for real time read/write applications.

Figure 2:
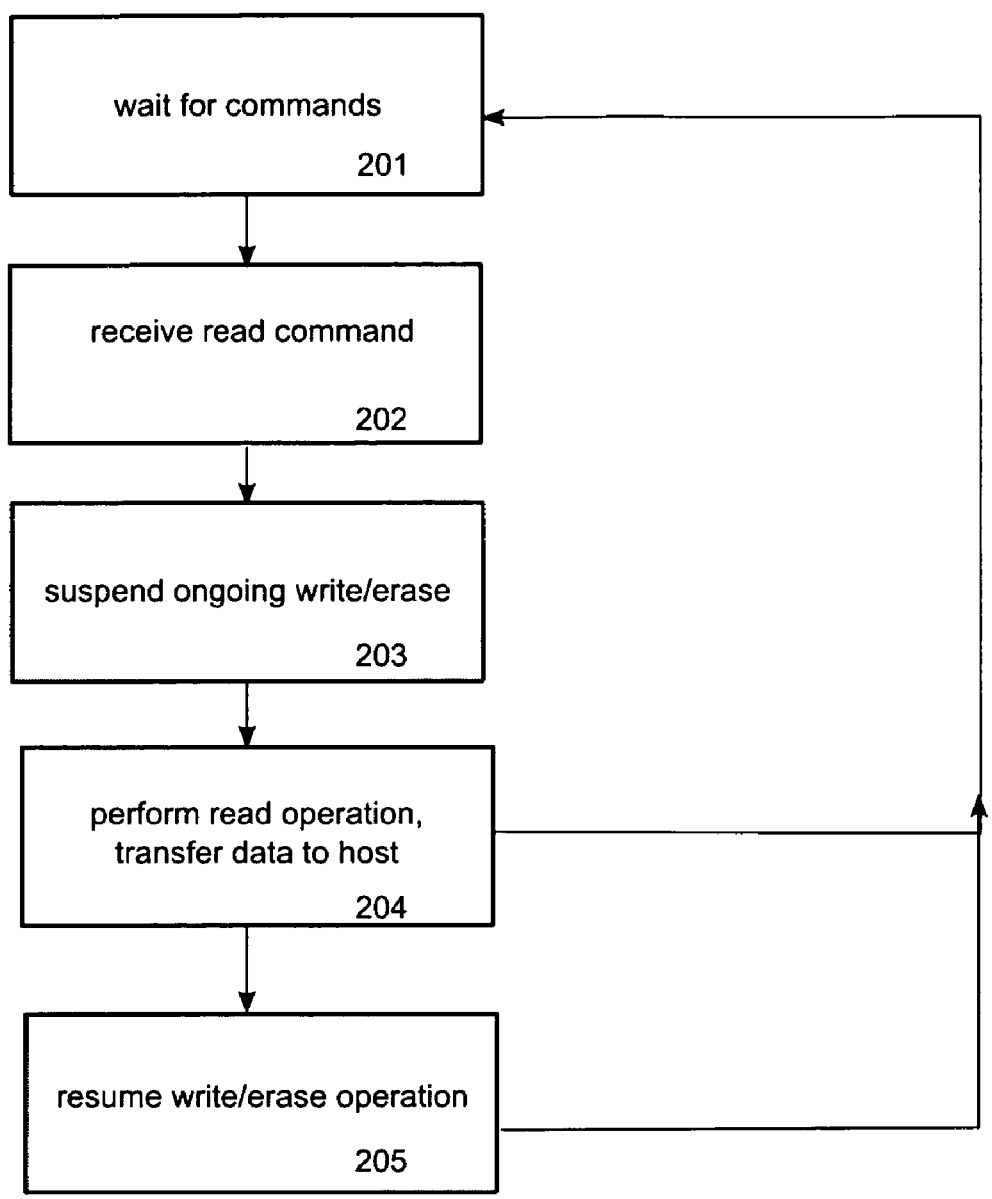
FIG. 2 is a flow chart of an automatic suspend on read procedure according to an embodiment of the invention.

For this purpose, several ways of implementing a new read command are feasible. One alternative is to define the set of commands in a way that any read command automatically has higher priority than erase/write commands. Then, use of a read command will trigger suspension of any ongoing operations on the memory chip. A possible implementation of such a automatic suspend on read procedure is shown in FIG. 2.

Figure 3:
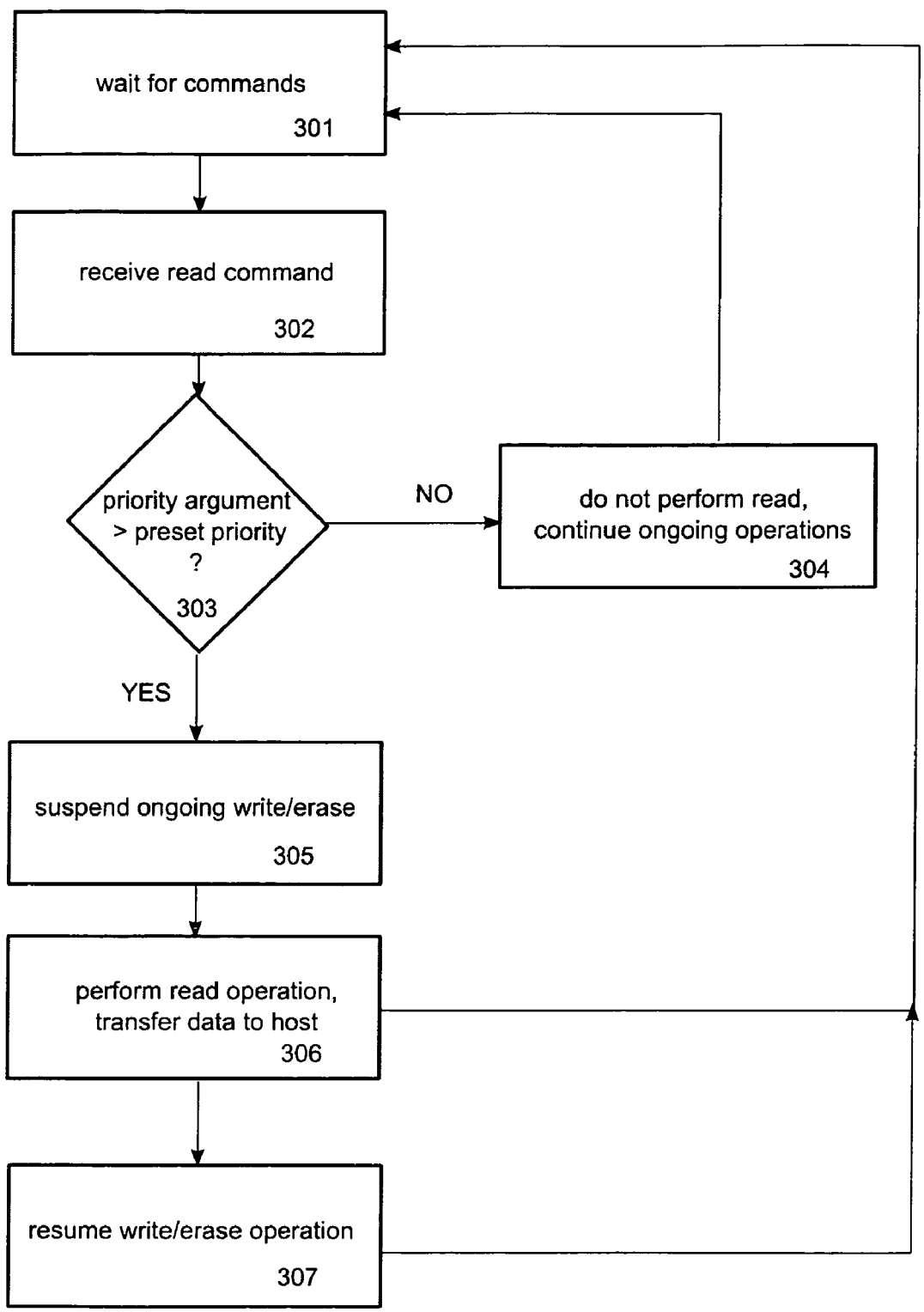
FIG. 3 is another flow chart showing a priority argument according to the method of invention.

To reserve the possibility to decide on suspensions as the case arises, the host may include a priority argument in the read command frame that is detectable by the memory controller, such that not all read operations would necessarily trigger suspension. An example embodiment for this is shown in FIG. 3. The memory controller waits to receive new commands from the host in step 301. When a read command is received (step 302), the priority argument which is enclosed in this command is checked by the memory controller (303). The priority argument may e.g. be implemented in such a way that certain conditions need to be fulfilled to trigger a suspension, or several priority classes might be defined that allow the memory controller to determine whether a read command has higher priority than an active write/erase operation. The prior initiation of this write/erase operation is not shown in FIG. 3. In the following it is assumed by way of example that the priority of the read command is given as a bit value or numerical value, and a preset priority threshold is defined for the memory controller. If the priority argument of the received read command exceeds the preset priority threshold, any ongoing write/erase operation or alternatively any operation, including a read operation, is suspended (step 305). If however the priority argument shows lower priority of the received read command, the ongoing operation is continued without interruption and the read command is not executed (step 304). This may be signalled to the host in a response. Optionally, the read command may be stored in a suitable manner by the memory controller and executed once the write/erase operation is completed.

After suspension of the write/erase operation, the memory controller performs the read operation and transfers the data requested by the read command to the host as shown in step 306. Following this, the write/erase operation may be resumed automatically by the memory controller (step 307). As can be seen from step 306, after the data transfer back to the host, the memory controller may already wait for new commands from the host. In this way a single write/erase operation or e.g. a sequential write may be suspended several times by read operations with corresponding priority arguments. Although the priority arguments are issued or included into the commands by the host, the memory controller is controlling the actual process.

Figure 4:
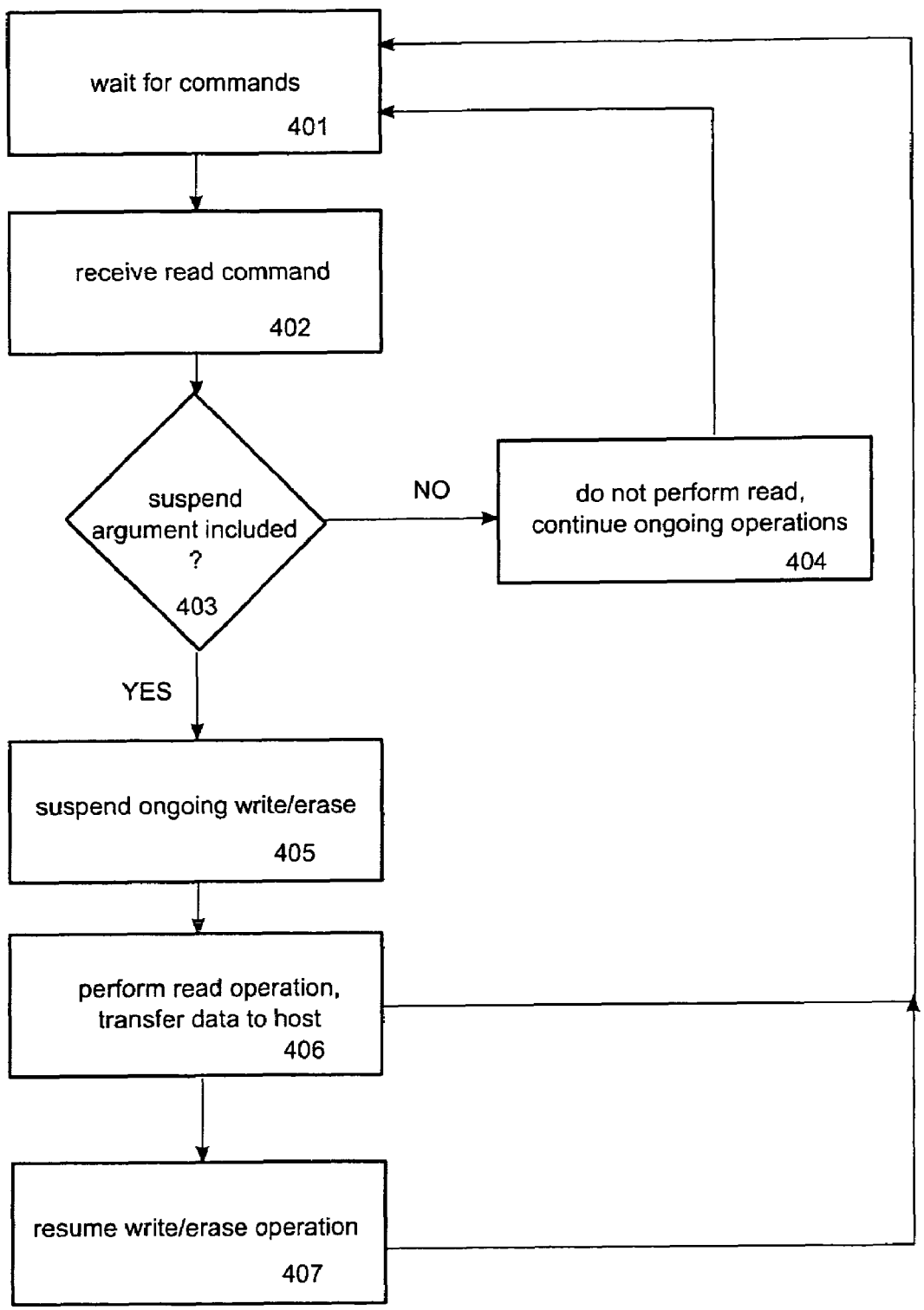
FIG. 4 is another flow chart showing a suspend argument according to the method of the invention.

In a similar way, a suspend argument may be added to a read command and thus trigger suspension of any other operation, as in the example of FIG. 4. When a read command is received by the memory controller in step 402, the memory controller would determine whether the read command includes a suspend argument or not, e.g. by checking a flag, in step 403. If a suspend argument is detected within the command, suspension of ongoing write operations and a subsequent read operation are performed as described for the case of a priority argument from step 305 onward. A read command without a suspend argument thus corresponds to a read command with lower priority of FIG. 3 and is only executed if no write/erase operation is in process on the memory unit.

Also, a separate suspend command may be issued that triggers suspension of ongoing operations, and subsequently any desired access command such as a read command may be processed on the memory chip in a conventional manner.

Yet another possibility is to suspend any ongoing data transfer from and to the flash memory device, and to immediately issue a fast read command. This suspension of data transfer may be triggered in a way similar to the suspension of ongoing access operations, i.e. by a read command with or without priority argument or by a separate suspend command.

The above command schemes or register extensions may be implemented on a state machine level so that suspension of write/erase operations or simultaneous read-while-write triggering enables a parallel state machine in addition to the existing access. This additional access may be regarded as a virtual port. In all given examples, control of the memory access may alternatively be exercised by the host device instead of the memory controller. Memory chip access may be address controlled or non-address controlled, e.g. implemented via Chip Select signals. The method of the invention might at first sight lead to increased cost of a system's flash memory due to additional logic needed and more expensive memory chips in general to support the idea of the invention. However, since in return typically less RAM will be required in a system, total memory cost in a system applying the method of the invention will be significantly reduced while at the same time further benefits as described for read latency are obtained.

Thus, a method is given to implement NAND flash memory devices with low read latencies, such that memory cards and/or embedded memory with large storage capacities and fast access times are facilitated. While the invention has been explained with regard to particular embodiments, memory types and specific command schemes, a person skilled in the art will recognise that those are to be understood by way of example only and are in no way intended to limit the scope of the invention given by the description and the appended claims and any combination thereof. The specification and drawings are, accordingly, also to be regarded in an illustrative rather than a restrictive sense.

What is claimed is:

1. A method for controlling access operations in a non-volatile memory device, the non-volatile memory device comprising a memory controller and at least one NAND type memory chip, wherein said NAND memory chip has suspend capability, the method comprising:
    suspending at least one write and/or erase operation on a first memory unit via a set of commands by said memory controller; and subsequently
    initiating a read operation on a second memory unit via a set of commands including a read command for initiating said read operation by said memory controller wherein said read command includes a priority argument; and
    deciding if an ongoing write/erase operation is to be suspended, on the basis of said priority argument.

2. The method of claim 1 said non-volatile memory device comprising at least two NAND flash memory chips, wherein said first and second memory units correspond to a first and a second NAND memory chip.

3. The method of claim 1 wherein said at least one non-volatile memory chip comprises a NAND flash memory chip capable of simultaneous read-while-write access, wherein said first memory unit is a first memory block and said second memory unit is a second memory block on said at least one memory chip.

4. The method of claim 3, said non-volatile memory device comprising at least two NAND memory chips, wherein said first and second memory blocks are memory blocks of two different NAND chips.

5. The method of claim 1 further comprising receiving at least one of said set of commands from an external host device by said memory controller.

6. A computer program product comprising program code means stored on a computer readable medium for carrying out the operations of claim 1 when executed on a computing or processing arrangement.

7. The method of claim 1, the method further comprising deciding if an ongoing data transfer to and/or from is to be suspended, on the basis of said priority argument.

8. A method for controlling access operations in a non-volatile memory device, the non-volatile memory device comprising a memory controller and at least one NAND type memory chip, wherein said NAND memory chip has suspend capability, the method comprising:
    suspending at least one write and/or erase operation on a first memory unit via a set of commands by said memory controller; and subsequently
    initiating a read operation on a second memory unit via a set of commands including a read command for initiating said read operation by said memory controller wherein said read command automatically triggers suspension of any ongoing write/erase operation and includes a suspend argument, and wherein said suspending any ongoing write/erase operation is performed responsive to said suspend argument.

9. The method of claim 8, wherein said read command automatically triggers suspension of any data transfer to and from said flash memory device.

10. A computer readable storage medium encoded with a computer program comprising code for carrying out the operations of claim 8 when executed on a computing or processing arrangement.

11. A non-volatile memory device, comprising a memory controller and at least one non-volatile memory chip, wherein first and second memory units are provided, wherein said memory controller is configured to initiate a write and/or erase operation on said first memory unit; and is further configured to initiate a read operation on said second memory unit via a set of commands, and wherein said memory controller is adapted to carry out said read and said write and/or erase operations simultaneously and is further configured to detect an additional priority argument or suspend argument in said set of commands.

12. The memory device of claim 11, wherein said memory controller is further configured to suspend access operations to a memory unit.

13. The memory device of claim 11, wherein said first and second memory units correspond to separate blocks of at least one NAND flash memory chip.

14. The memory device of claim 11, comprising at least two NAND flash memory chips, wherein said first and second memory units correspond to a first and a second NAND flash memory chip.

15. A device according to claim 11 comprising:
    means for initiating a write and/or erase operation on a first memory unit of said memory device;
    means for initiating a read operation on a second memory unit of said memory device; and
    means for controlling said read and write/erase operations to be performed simultaneously.

16. A host device comprising:
    a data transfer unit configured to communicate data between a host device and a flash memory device, a command unit configured to issue control commands including at least one command including a priority or suspend argument to said flash memory device; and
    wherein said host device is capable of controlling said flash memory device such that a second access operation is initiated on said flash memory device before a first ongoing access operation is completed.

17. A memory module comprising a memory controller and at least one nonvolatile memory chip, wherein first and second memory units are provided,
    wherein said memory controller is configured to initiate a write and/or erase operation on said first memory unit; and is further configured to initiate a read operation on said second memory unit via a set of commands; and
    wherein said memory controller is adapted to perform said read and said write and/or erase operations simultaneously and is further configured to detect a priority argument or suspend argument in said set of commands.

18. A system comprising:

a memory module including,
- a memory controller and at least one nonvolatile memory chip, wherein first and second memory units are provided;
- wherein said memory controller is configured to initiate a write and/or erase operation on said first memory unit; and is further configured to initiate a read operation on said second memory unit via a set of commands;
- wherein said memory controller is adapted to perform said read and said write and/or erase operations simultaneously and is further configured to detect a priority argument or suspend argument in said set of commands; and a host device including,
- a data transfer unit configured to communicate data between said host device and a flash memory device,
- a command unit configured to issue control commands to said flash memory device; and
- wherein said host device is capable of controlling said flash memory device such that a second access operation is initiated on said flash memory device before a first ongoing access operation is completed.

* * * * *

UNITED STATES PATENT AND TRADEMARK OFFICE
CERTIFICATE OF CORRECTION

PATENT NO. : 7,562,180 B2
APPLICATION NO. : 11/390969
DATED : July 14, 2009
INVENTOR(S) : Yevgen Gyl It is certified that error appears in the above-identified patent and that said Letters Patent is hereby corrected as shown below:

Column 5, Claim 2, line 39: "claim 1 said" should be --claim 1, said--.

Column 5, Claim 3, line 43: "claim 1 wherein" should be --claim 1, wherein--.

Column 5, Claim 5, line 53: "claim 1 further" should be --claim 1, further--.

Column 6, Claim 10, line 16: "comprising code" should be --comprising program code--.

Signed and Sealed this

Third Day of November, 2009

David J. Kappos
*Director of the United States Patent and Trademark Office*